United States Patent [19]
Fuschetti

[11] Patent Number: 5,429,680
[45] Date of Patent: Jul. 4, 1995

[54] THERMOELECTRIC HEAT PUMP

[76] Inventor: Dean F. Fuschetti, 69 Winding Way, Little Silver, N.J. 07739

[21] Appl. No.: 154,787

[22] Filed: Nov. 19, 1993

[51] Int. Cl.⁶ .................................................. H01L 35/28
[52] U.S. Cl. ..................................... 136/203; 136/224; 136/237
[58] Field of Search ................. 136/203, 204, 224, 225, 136/237

[56] References Cited

U.S. PATENT DOCUMENTS

| | | | |
|---|---|---|---|
| 3,000,092 | 9/1961 | Scuro | 29/472.9 |
| 3,249,470 | 5/1966 | Naake | 136/4 |
| 3,261,079 | 7/1966 | Clingman, Jr. et al. | 29/155.5 |
| 3,296,033 | 1/1967 | Scuro et al. | 136/205 |
| 3,528,893 | 9/1970 | Christie et al. | 204/38 |
| 3,547,706 | 12/1970 | McGrew | 136/205 |
| 3,650,844 | 3/1972 | Kendall, Jr. et al. | 136/237 |
| 3,859,143 | 1/1975 | Krebs | 136/205 |
| 3,988,171 | 10/1976 | Miller et al. | 136/237 |
| 4,007,061 | 2/1977 | Le Coutrier | 136/221 |
| 4,855,810 | 8/1989 | Gelb et al. | 357/87 |

FOREIGN PATENT DOCUMENTS 2171254A 8/1986 United Kingdom ............... 136/237

Primary Examiner—Donald P. Walsh
Assistant Examiner—Chrisman D. Carroll
Attorney, Agent, or Firm—R. Gale Rhodes, Jr.

[57] ABSTRACT

A thermoelectric heat pump including combination adherent and metal migration barrier layers intermediate the ends of the n-type and p-type semi-conductors and the metallic electrical conductors, the layers enhance the adherence to the ends of the semiconductors and prevent migration or diffusion of metal into the semiconductors.

5 Claims, 1 Drawing Sheet

THERMOELECTRIC HEAT PUMP

BACKGROUND OF THE INVENTION

This invention relates generally to a new and improved thermoelectric heat pump and more particularly relates to an improved thermoelectric heat pump of the type generally disclosed in U.S. Pat. No. 4,007,061, patented Feb. 8, 1977, entitled THERMOELECTRIC HEAT PUMP, Georges LeCouturier inventor, and U.S. Pat. No. 4,855,810, patented Aug. 8, 1989, entitled THERMOELECTRIC HEAT PUMP, Allan S. Gelb et al. inventors, and more particularly to an improvement of the thermoelectric heat pump disclosed in the second identified patent.

A typical simple thermoelectric heat pump is illustrated diagrammatically in FIG. 1 and is identified by general numerical designation 10. Heat pump 10 is for transferring heat from the body to be cooled, or heat source, 12 to a heat sink 14 and includes a pair of n-type and p-type semiconductors 15 and 16 having their upper ends connected to a copper conductor or bus 17 and having their opposed lower ends connected respectively to copper conductors or busses 18 and 19 either directly by soldering or indirectly by being soldered to nickel/tin plating provided on the conductors 18 and 19 as known to the art. The copper conductors 17 and 18 and 19 are connected by low temperature solder as known to the art, respectively to the electrical insulation members 20 and 21, which are also good heat conductors and which may be for example ceramic. The insulation members 20 and 21 are connected respectively to the body to be cooled 12 and the heat sink 14 by mechanical bolting, thermal glue or low temperature solder. An electrical circuit, including a dc source 22, is connected between the electrical conductors or busses 17 and 18 and 19. Heat from the body to be cooled 12 is pumped thermoelectrically to the heat sink 14 at a rate proportional to current passing through the circuit and the number of pairs of n-type and p-type semiconductors included in the heat pump 10. The opposed ends of the n-type and p-type semiconductors 15 and 16 are typically connected or adhered to the copper conductors or busses 17 and 18 and 19 by relatively low temperature solder having a melting point of about 86° C. The reason that such low melting point solder is used is that it is such low melting point solder that can be used to adhere to both the n-type and p-type semiconductors 15 and 16 to the copper conductors or busses 17 and 18 and 19 and to adhere such busses to the insulation members 20 and 21.

As is further known to those skilled in the art, the higher the temperature at which the thermoelectric heat pump can operate, the greater the amount of heat that can be pumped thermoelectrically from the body to be cooled to the heat sink, but the higher the temperature at which the thermoelectric heat pump operates the greater the heat present and such greater heat can undesirably melt the solder connection between the semiconductors and the copper busses thereby deteriorating and ultimately ruining the operation of the thermoelectric heat pump. More particularly, use of the above-noted relatively low temperature solder having a melting point of about 86° C. practically restricts the operating temperature of the heat pump to a temperature below such solder melting point typically, as indicated by good practice as known to the art, about 25° C. below the melting point of the solder. Accordingly, there exists a need in the thermoelectric heat pump art for a heat pump that can use relatively high temperature solder having a melting point of at least about 220° C. to about 330° C. so as to increase the temperature at which the heat pump can operate thereby increasing its efficiency and rate at which it can thermoelectrically pump heat.

As is further known to those skilled in the art, a further problem with thermoelectric heat pumps of the type illustrated diagrammatically in FIG. 1 is that the solder used to connect or adhere the opposed ends of the semiconductors 15 and 16 to the copper busses 17 and 18 and 19 typically includes a metal component which, as is further known, tends to migrate or diffuse into the semiconductors during prolonged operation of the heat pump which increases the conductivity of the semiconductors and decreases their semi-conductivity which is deleterious to their operation and which ultimately can be ruinous; metal also tends to migrate or diffuse into the semiconductors from the electrical conductors or busses 17 and 18 and 19 causing the same problem. A solution to this metal or metal diffusion or migration problem is disclosed in U.S. Pat. No. 4,855,810 identified above, and such solution is the inclusion of coatings or plated layers of nickel 16 and 18, shown in FIG. 1 of this patent and which plated layers of nickel are taught as being metal or metallic diffusion barrier plates, coatings or layers. Such layers of nickel are plated onto the opposed ends of the semiconductors, but as is further known to the art nickel does not plate and adhere to semiconductor material as well as is desired. This presents another problem as known to those skilled in the art, because the semiconductors are made in large sheets or layers of semiconductor material, the nickel plated thereon, after which the discrete or individual n-type and p-type conductors are produced by cutting the large layers of nickel plated semiconductor material into such discrete semiconductors. The cutting of the large layers of nickel plated semiconductors into discrete plated n-type and p-type semiconductors has the known problem of the plated nickel tending to delaminate during the cutting process. Accordingly, there exists a further need in the art for enhanced adherence of such layers or platings of nickel to the opposed ends of the semiconductors.

SUMMARY OF THE INVENTION

It is the object of the present invention to satisfy the foregoing needs in the thermoelectric heat pump art.

A thermoelectric heat pump satisfying such need includes combination adherent and metal migration barrier layers intermediate the ends of the n-type and p-type semi-conductors and the metallic electrical conductors, the layers enhance the adherence to the ends of the semiconductors and prevent migration or diffusion of metal into the semiconductors.

DESCRIPTION OF THE PREFERRED EMBODIMENT

Figure 1:
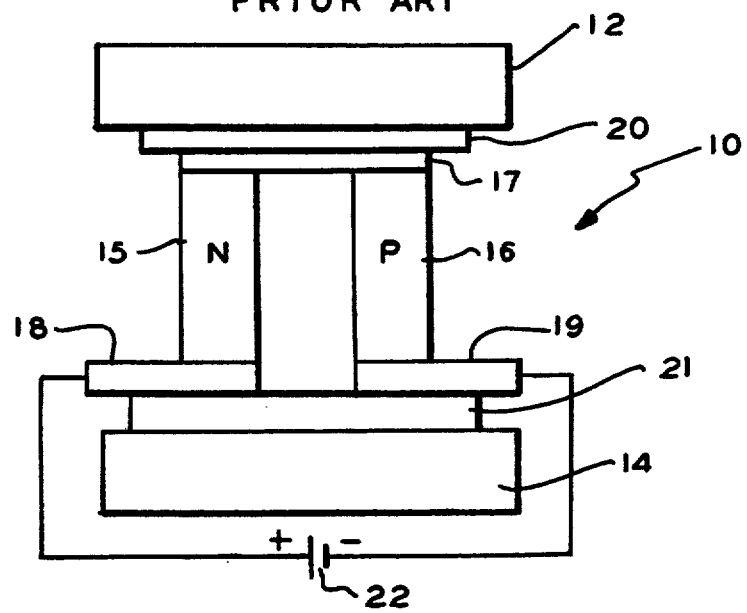
FIG. 1 is a diagrammatical elevational view of a prior art thermoelectric heat pump.
Figure 2:
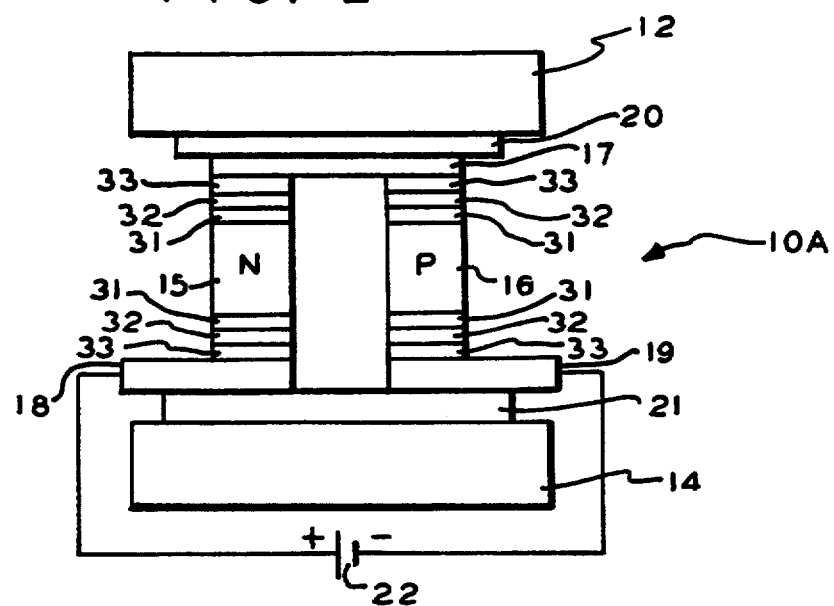
FIG. 2 is a diagrammatical elevational view of a thermoelectric heat pump embodying the present invention.

The preferred embodiment of the thermoelectric heat pump of the present invention is shown in FIG. 2 and identified by general numerical designation 10A. The elements in the thermoelectric heat pump 10A which are the same as the elements in the prior art heat pump shown in FIG. 1 and described above are given the same numerical designations in FIG. 2 for convenience of reference and understanding.

The opposed upper and lower ends of the pair of n-type and p-type semiconductors 15 and 16 are provided with first and second 18 layers of material 31 and 32 and such layers permit the opposed ends of the semiconductors to be connected to the copper busses or conductors 17 and 18 and 19 by relatively high temperature solder indicated by numerical designation 33. It will be generally understood that the layers 31 enhance the adherence of the layers 32 to the semiconductors 15 and 16, and it will be understood that the layers 32 are for preventing migration of metal from the solder 33 and/or electrical conductors or busses 17 and 18 and 19 into the semiconductors. It will be further generally understood that the relatively high temperature solder 33 permits the thermoelectric heat pump 10A to operate at higher temperatures thereby enhancing the efficiency of the heat pump and the rate at which it can thermoelectrically pump heat.

The layers 31 are nickel, or a nickel alloy such as for example about 95% nickel and about 5% aluminum or about 80% nickel and about 20% aluminum, and are thermally sprayed onto the opposed ends of the semiconductors 15 and 16 preferably by electric arc spraying; in the preferred embodiment the layers 31 are pure nickel (about 99.9% nickel). Layers 31 have a thickness of about 0.002 to about 0.005 inch.

The layers 32 are plated onto the layers 31 and are chosen from a group of materials consisting of nickel-boron (about 1–4% boron), nickel-low phosphorous (about 2% phosphorous), nickel-medium phosphorous (about 8% phosphorous), nickel-high phosphorous (from about 10% to about 13% phosphorous), palladium, rhodium, gold and gold alloys. Electrolytic or electroless plating may be used. Upon electroless plating being used, the material 32 is chosen from a group of material preferably consisting of the above-noted nickel-boron and the above-noted various nickel-phosphorous compositions. Upon the electrolytic plating method being used, the material of layer 32 is chosen from a group consisting of gold, gold alloys and nickel.

The thermally sprayed layers of nickel, or nickel alloy, 31 are relatively porous but enhance the adherence of the electrolytic and electroless plated layers 32 to the opposed ends of the semiconductors 15 and 16.

Pull tests performed on 1.4 mm sq of the layers 31 and 32 have a resistance greater than 4–5 lbs, typically about 8 lbs., and has been found to be as high as 10 lbs of pull before delamination.

It will be understood that the layers 31 and 32 as described above may be considered to be combination adherent and metal migration barrier means with the layers 31 enhancing the adherence of the layers 32 to the opposed ends of the semiconductors 15 and 16 and with the layers 32 substantially preventing migration or diffusion of metal from the solder 33 and electrical conductors or busses 17 and 18 and 19 into the semiconductors 15 and 16; the layers 31 enhance the mechanical strength of the semiconductors 15 and 16 at the interface between the layers and the opposed ends of the semiconductors. It will be further understood that the layers 31, although porous as noted above, function as a barrier to metal migration in the semiconductors, but the layers 32 substantially eliminate the porosity of the layers 31 and form a more substantial barrier to the metal migration. Still further, it has been discovered that the presence of both layers 31 and 32 increase their adherence to the ends of the semiconductors and enhance metal migration barrier and do so in combination greater than either can do alone.

Referring again to the above-identified U.S. Pat. No. 4,855,810, the thickness of the metal or metal diffusion or migration barrier plates or coatings is taught to be from about 10 microinches (0.00001 inch) to 150 microinches (0.00015 inch) and such platings or coatings are taught to be soldered with a solder, e.g. lead-antimony having a eutectic or melting point of about 251° C. As is further known to those skilled in the thermoelectric heat pump art, for prolonged life prior art thermoelectric heat pumps are typically operated in a temperature range below the melting point of the solder used to connect or adhere the components of the heat pump and, typically, this range is from about 25° C. to about 75° C. below the melting point of such solder. Accordingly, good practice would indicate that thermoelectric heat pumps of the type disclosed in U.S. Pat. No. 4,855,810 would be operated at about 100° C. to about 200° C. It has been found that by providing combination adherent and metal migration barrier layers with the plated layer of such combination having a thickness of from about 0.001 inch to about 0.003 inch, relatively high temperature solder having a melting point of about 220° C. to about 330° C. can be used to connect or adhere the opposed ends of the pairs of semiconductors to the metallic conductors or busses. Thus, following the above-noted good practice, thermoelectric heat pumps embodying the present invention, such as thermoelectric heat pump 10A of FIG. 2, can be operated at 145° C. to about 305° C. with reasonably expected long life. These higher operating temperatures permit the thermoelectric heat pump to operate more efficiently and thermoelectrically pump greater amounts of heat over the same period of time.

As is known to those skilled in the art, the n-type and p-type semiconductors 15 and 16 presently used in thermoelectric heat pumps can withstand temperatures of from about 315° C. to about 371° C. If the semiconductors are maintained at the lower temperature for a prolonged period of time, the semiconductors 10 degrade with such degradation being time related but if the semiconductors are operated at the higher end of about 371° C. they are typically destroyed with little relationship to time.

Relatively high temperature solder (layers of solder 33 shown in FIG. 2) which may be used advantageously in the present invention may be chosen from a group consisting of pure lead (having a melting point of about 327° C.); pure tin (having a melting point of about 232° C.); a composition comprising about 96½% tin and about 3½% silver (having a melting point of about 221° C.); a composition comprising about 95% tin and about 5% antimony (having a melting point of about 240° C.); a composition comprising about 97½% lead and about 2½% silver (having a melting point of about 303° C.); a composition comprising about 97½% lead, about 1½% silver and about 1% tin (having a melting point of about 308° C.); Indalloy-167 (having a melting point of about 315° C. and including about 98% lead, 1.5% antimony and 0.8% gallium); Indalloy-182 (having a melting point of about 280° C. and including about 80% gold, 20% tin); and Indalloy-164 (having a melting point of about 310° C. and including about 92% lead, 5% indium and 2.5% silver). Indalloy-167 and 182 are available from Indium Corporation of America. Accordingly, a thermoelectric heat pump utilizing one of the foregoing solders will have an expected operating temperature range of about 145° to about 305° C.

Figure 3:
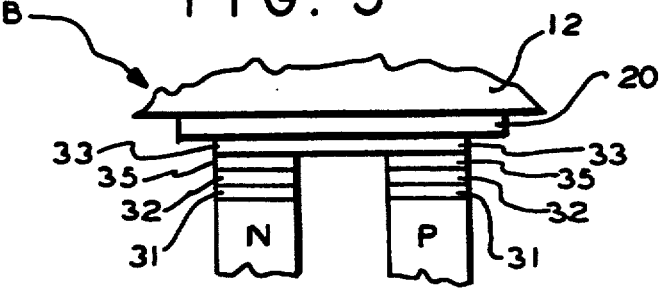
FIG. 3 is a partial diagrammatical elevational view of an alternate embodiment of a thermoelectric heat pump of the present invention.

Referring now to FIG. 3, a further alternate embodiment of the thermoelectric heat pump embodying the present invention is partially illustrated and indicated by general numerical designation 10B; elements of thermoelectric heat pump 10B which are the same as elements shown in FIG. 2 and described above are given the same numerical designations for convenience of reference and ease of understanding. In this embodiment, the electric conductors or busses 17 and 18 and 19 shown in FIGS. 1 and 2 are eliminated and are replaced by a layer of electrically conductive material 35, e.g. copper, thermally sprayed onto the layer 32 and which may have a thickness of about 0.001 to about 0.008 inch; alternatively, although a slower process, the layer 35 may be plated onto the layer 32. In this embodiment, the high temperature solder 33 bridges across the layers of copper 35, and it is the combination of the solder layer 33 and the copper layers 35 that forms the buss system replacing copper buss 17 as shown in FIGS. 1 and 2. The layer 35 may be chosen from a suitable copper or copper alloy. The layer 35 may be soldered to the insulation member 20 by the relatively high temperature solder 33 shown in FIG. 2 and described above. As known to the art, copper has a tendency to oxidize reducing its solderability and if desired or required the layer of conductive material 35 may be provided with a plated coating of nickel, gold, silver or tin or any plated layer reducing oxidization of the layer 35 and enhancing its solderability.

As is further known to those skilled in the art, the heat sink, such as heat sinks 14 illustrated diagrammatically in FIGS. 1 and 2 are typically connected to the electrical insulation member 21, FIG. 1, by gluing or bolting. However, a further advantage of the present invention which permits the use of the relatively high temperature solder 33, FIG. 1, and described above is that such high temperature solder can be used to adhere or connect the heat sink 14 to the electrical insulation member 21 which is more efficient in manufacturing and which enhances the transfer of heat to the heat sink.

Thermoelectric heat pumps, as is further known to those skilled in the art, can be used to generate electricity by exposing the body 12 and heat sink 14 to relatively widely different temperatures. The wider the temperature differential between the body 12 and the heat sink 14, the greater the amount of electricity that is produced and, as is further known, the production of such electricity produces heat and thus the use of the relatively high temperature solder 33 of the present invention permits a thermoelectric heat pump embodying the present invention to operate at relatively higher temperatures thereby increasing the efficiency of electrical production.

It will be understood that many variations and modifications may be made in the present invention without departing from the spirit and the scope thereof.

What is claimed is:

1. An improved thermoelectric heat pump, comprising:
   at least one pair of n-type and p-type semiconductors, said semiconductors having first and second opposed ends;
   a pair of electrical insulation members generally opposite and spaced from said opposed ends of said semiconductors;
   a first metallic electrical conductor intermediate said first ends of said semiconductor members and one of said pair of insulation members and connected to said one insulation member, and second and third metallic electrical conductors respectively intermediate said second ends of said semiconductors and the other of said pair of insulation members and connected to said other insulation member;
   a first combination adherent and metal migration barrier means intermediate said first ends of said semiconductors and said first metallic electrical conductor and adhered to said first ends of said semiconductors, and second and third combination adherent and metallic migration barrier means respectively intermediate said second ends of said semiconductors and said second and third metallic electrical conductors and adhered to said second ends of said semiconductors;
   solder intermediate said metallic electrical conductors and said combination members, said solder connecting said first combination means to said first electrical conductor and connecting said second and third combination means to said second and third metallic electrical conductors, said solder including at least one metal component and having a melting point of at least about 220° C. to about 330°;
   said combination adherent and metal migration barrier means enhancing the adherence of such combination means to said semiconductors and substantially preventing migration of metal from said metallic electrical conductors and said solder into said semiconductors;
   said combination adherent and metal migration barrier means comprising first and second layers, said first layer being adhered to said opposed first and second ends of said semiconductor members and said first layer enhancing the adherence of said second layer to said first and second opposed ends of said semiconductors, and said second layer adhered to said metallic electrical conductor members by said high temperature solder and said second layer substantially preventing said migration of said metal into said semiconductors; and
   said second layers plated onto said first layer by electroless plating and said second layer chosen from a group of materials consisting of nickel-boron and nickel-phosphorous.

2. The thermoelectric heat pump according to claim 1 wherein said first layer is thermally sprayed onto said opposed ends of said semiconductors and wherein said first layer is nickel or nickel alloy.

3. The thermoelectric heat pump according to claim 2 wherein said first layer of nickel or nickel alloy is thermally sprayed onto said first and second opposed ends of said semiconductors by electric arc spraying and has a thickness of about 0.002 to about 0.005 inch.

4. The thermoelectric heat pump according to claim 1 wherein said second layer has a thickness from about 0.001 to about 0.003 inch.

5. The thermoelectric heat pump according to claim 1 wherein said solder is chosen from a group consisting of pure lead having a melting point of about 327° C., pure tin having a melting point of about 232° C.; a composition comprising about 96½% tin and about 3½% silver having a melting point of about 221° C.; a composition comprising about 95% tin and about 5% antimony having a melting point of about 240° C.; a composition comprising about 97½% lead and about 2½% silver having a melting point of about 303° C.; a composition comprising about 97½% lead, about ½% silver and about 1% tin having a melting point of about 308° C.; Indalloy-167 having a melting point of about 315° C. and including about 98% lead, 1.5% antimony and 0.8% gallium; Indalloy-182 having a melting point of about 280° C. and including about 80% gold, 20% tin; and Indalloy-164 having a melting point of about 310° C. and including about 92% lead, 5% indium and 2.5% silver.

* * * * *